(12) United States Patent
Shiraga et al.

(10) Patent No.: US 8,867,208 B2
(45) Date of Patent: Oct. 21, 2014

(54) ELECTRONIC DEVICE

(75) Inventors: Kazuhiro Shiraga, Osaka (JP); Shinji Goto, Osaka (JP); Naoyuki Ito, Osaka (JP)

(73) Assignee: Panasonic Corporation, Kadoma-shi (JP)

( * ) Notice: Subject to any disclaimer, the term of this patent is extended or adjusted under 35 U.S.C. 154(b) by 224 days.

(21) Appl. No.: 13/550,619

(22) Filed: Jul. 17, 2012

(65) Prior Publication Data

US 2013/0021751 A1    Jan. 24, 2013

(30) Foreign Application Priority Data

Jul. 19, 2011  (JP) .................................. 2011-157548
Jul. 11, 2012  (JP) .................................. 2012-155793

(51) Int. Cl.
*H05K 7/20*       (2006.01)
*H01L 23/427*     (2006.01)
*G06F 1/20*       (2006.01)
*H01L 23/467*     (2006.01)

(52) U.S. Cl.
CPC ............. *H01L 23/427* (2013.01); *H01L 23/467* (2013.01); *G06F 1/203* (2013.01)
USPC ....... 361/697; 361/679.48; 361/695; 454/184

(58) Field of Classification Search
CPC . H05K 7/20; H05K 7/20181; H05K 7/20972; H01L 23/427; H01L 23/434; G06F 1/16
USPC ............... 361/679.46–679.55, 688–704, 715, 361/719–724; 165/80.2, 80.3, 80.4, 80.5, 165/104.33, 121–126, 185; 174/15.1, 16.3, 174/252; 257/706–727; 454/184
See application file for complete search history.

(56) References Cited

U.S. PATENT DOCUMENTS

| | | | |
|---|---|---|---|
| 7,345,874 B2 * | 3/2008 | Cheng et al. | 361/695 |
| 7,362,568 B2 * | 4/2008 | Huang | 361/679.48 |
| 7,643,295 B2 * | 1/2010 | Chao et al. | 361/700 |
| 7,830,663 B2 * | 11/2010 | Iikubo | 361/697 |
| 2007/0131383 A1 * | 6/2007 | Hattori et al. | 165/11.1 |
| 2008/0253088 A1 * | 10/2008 | Tracy et al. | 361/695 |
| 2010/0079947 A1 * | 4/2010 | Aoki | 361/695 |

FOREIGN PATENT DOCUMENTS

JP       2008-306001 A       12/2008

* cited by examiner

*Primary Examiner* — Michail V Datskovskiy
(74) *Attorney, Agent, or Firm* — James W. Judge

(57) ABSTRACT

A notebook computer 1 is provided with: a casing 20*a* in which electronic components including a CPU are accommodated; and a heat-dissipating unit 30 that includes a heat-dissipating component 37 having a plurality of fins 37*a* to which heat is transferred from the CPU, and a fan 31 for supplying air to the heat-dissipating component 37, and, in the heat dissipating unit 30, heat exchange between heat transferred from the CPU to the heat-dissipating component 37, and air supplied from the fan 31, is performed to release heated air to the exterior of the casing 20*a*. A communicating path 36 is formed, between an air outlet 32*b* of the fan 31, and an inflow surface 37*b* of the heat-dissipating component 37, for communicating therebetween, and a dust removal path 38 is formed in the communicating path 36 so as to communicate with the exterior of the casing 20*a*.

6 Claims, 9 Drawing Sheets

PRIOR ART

ELECTRONIC DEVICE

FIELD

The present disclosure relates to an electronic device having mounted thereto a heat-dissipating unit that has a heat-dissipating component including a plurality of fins for heat exchange.

DESCRIPTION OF THE RELATED ART

Electronic devices of this sort are, for example, notebook computers. In heat-dissipating units mounted to notebook computers, heat from electronic components (heat-emitting components), such as a central processing unit (CPU), which emit heat during operation, is transferred through a heat pipe or the like to a heat-dissipating component, heat exchange with air (cooling air) supplied from a fan is performed, and heated air is released to the exterior of a casing of the notebook computer or the like, thereby effectively cooling the heat-emitting components.

In a conventional heat-dissipating unit of this sort, it is effective to increase the surface area of the fins in order to enhance the heat-dissipating effect, and a plurality of fins are aligned in a narrow, limited space at short intervals. However, when the intervals at which the plurality of fins are aligned are short, fine dust contained in air (cooling air) supplied from the fan is likely to adhere to, particularly, a surface of a heat-dissipating component on a side (air inlet side) on which the heat-dissipating component and the fan are opposed to each other. Once dust adheres to the heat-dissipating component, dust is likely to accumulate rapidly, and the accumulated dust covers the entire surface of the heat-dissipating component on the air inlet side. As a result, it is difficult to supply cooling air from the fan into the gaps that are formed between adjacent fins, and consequently there is significant deterioration in the heat-dissipating effect of the heat-dissipating unit.

A heat-dissipating unit having a mechanism for removing dust on a heat-dissipating component, as described below, has been suggested to date (Japanese Laid-Open Patent Publication No. 2008-306001)

Figure 9:
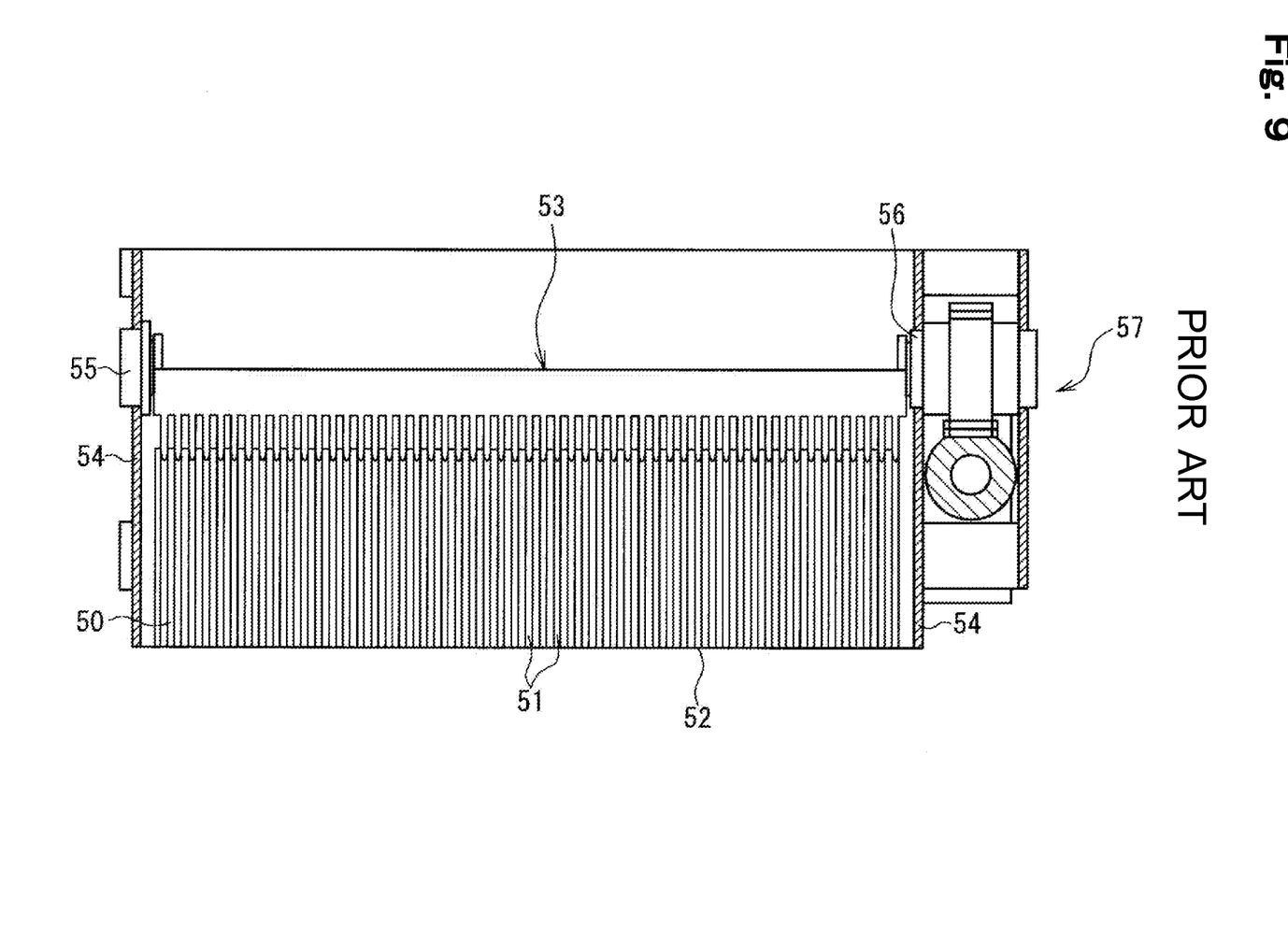
FIG. 9 is a schematic horizontal cross-sectional view of a structure of a conventional heat-dissipating unit.

Referring to FIG. 9, a heat-dissipating unit suggested in the aforementioned Japanese Laid-Open Patent Publication No. 2008-306001 includes: a heat-dissipating component 50 having a plurality of flow paths 51 formed therein, and having a plurality of fins 52 for heat exchange; a brush 53, disposed on the air inlet side of the heat-dissipating component 50, which acts as a cleaning component for removing dust on the heat-dissipating component 50 by being inserted into the flow paths 51; a brush rotation pivot 55 and a brush driving pivot 56 for supporting the brush 53 such that the brush 53 is rotatably mounted to an outer component 54; and a brush driving section 57, such as, for example, a motor, capable of driving the brush 53.

SUMMARY

However, in an electronic device having mounted thereto the heat-dissipating unit suggested in Japanese Laid-Open Patent Publication No. 2008-306001, a brush and a brush driving section, such as a motor, need to be additionally incorporated. Therefore, the number of components and the number of assembly process steps are increased, and, further, a space in which these components are mounted needs to be reserved. Accordingly, a problem arises that cost is increased. Further, in the electronic device having mounted thereto the heat-dissipating unit suggested in Japanese Laid-Open Patent Publication No. 2008-306001, a problem arises that increase of the number of components leads to an increase in the weight.

The present disclosure is made in order to solve the problems of the conventional techniques, and an object of the present disclosure is to make available an electronic device having mounted thereto a heat-dissipating unit that enables an increase of cost and increase in the weight to be restrained, and enables dust on a heat-dissipating component to be removed with a simplified structure.

In order to attain the aforementioned object, an electronic device of the present disclosure includes: a casing in which electronic components including a heat-emitting component, which emits heat during operation, are accommodated; and a heat-dissipating unit that includes a heat-dissipating component having a plurality of fins to which heat is transferred from the heat-emitting component, and a fan for supplying air to the heat-dissipating component, in which heat exchange between heat transferred from the heat-emitting component to the heat-dissipating component, and air supplied from the fan, is performed to release heated air to the exterior of the casing. In the electronic device, a communicating path is formed, between an air outlet of the fan, and a surface of the heat-dissipating component on a side that opposes the fan, for communicating therebetween; and a dust removal path is formed in the communicating path so as to communicate with the exterior of the casing.

DETAILED DESCRIPTION

An electronic device according to the present disclosure is structured such that, when air is drawn through a dust removal path by using a cleaner or the like, air outside a casing is drawn through gaps among a plurality of fins of a heat dissipating component, a communicating path, and the dust removal path, and dust on a surface of the heat-dissipating component on a side that opposes a fan is drawn together with the air. Thus, according to the present disclosure, the electronic device can be provided which has mounted thereto a heat-dissipating unit that enables an increase of cost and increase in the weight to be restrained, and enables dust on the heat-dissipating component to be removed, with a simplified structure in which the communicating path is formed between an air outlet of the fan and the surface of the heat-dissipating component on the side that opposes the fan so as to communicate therebetween, and the dust removal path communicating with the exterior of the casing is formed in the communicating path.

Hereinafter, an embodiment will be described in detail with reference to the drawings as necessary. However, unnecessarily detailed description may not be given. For example, matters that have been already well known may not be described in detail or substantially the same components may not be repeatedly described. This is to prevent the following description from being redundant, in order to allow a person of ordinary skill in the art to easily understand the embodiment.

The inventors provide the following description and the accompanying drawings in order to allow a person of ordinary skill in the art to sufficiently understand the present disclosure, and the description and the drawings are not intended to restrict the subject matter of the scope of claim for patent.

Hereinafter, an exemplary case in which an electronic device is a notebook computer will be described in more detail based on an embodiment.

[Structure of Electronic Device]

Figure 1:
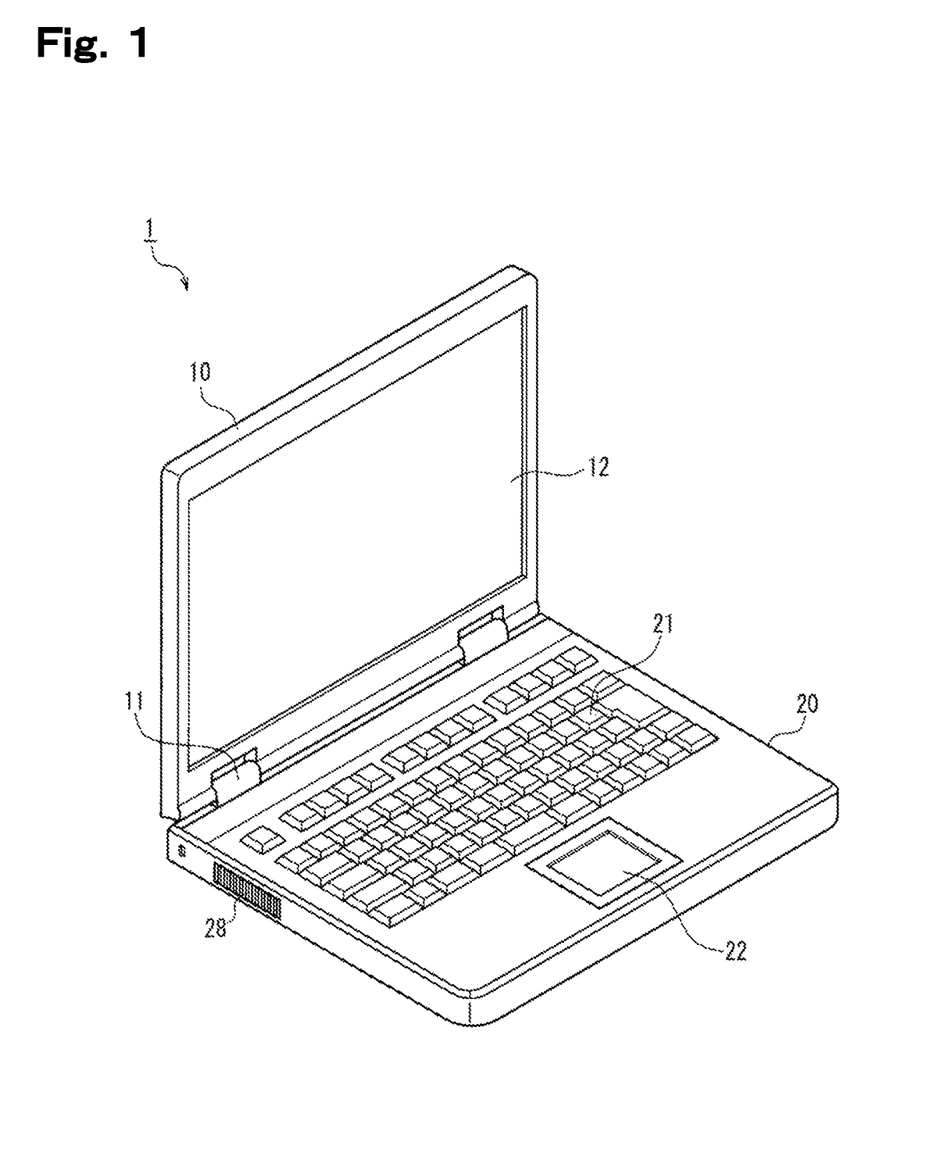
FIG. 1 is a schematic perspective view of an external structure of a notebook computer as an example of an electronic device according to one embodiment.

FIG. 1 is a schematic perspective view of an external structure of a notebook computer 1 according to one embodiment.

As shown in FIG. 1, in the notebook computer 1, a cover component 10 having a display device 12, such as a liquid crystal panel, disposed in an inner side surface thereof is mounted so as to be pivotable, by means of a hinge mechanism 11, relative to a main unit 20 having input devices, such as a keyboard 21 and a pointing device 22, disposed on the surface thereof.

Inside the main unit 20, a not-illustrated secondary battery acting as a power supply for operating the notebook computer 1, a not-illustrated hard disk drive (HDD) acting as a main storage device, and other electric components are disposed. The notebook computer 1 can include, for example, an antenna module for wireless LAN communication, a disk drive for blu-ray discs and DVD discs, a web camera device, a sound microphone and loudspeaker, and various other input/output terminals. The functions and shapes thereof are the same as those of conventionally well-known notebook computers, and illustration and detailed description thereof are not given.

[Structure of Heat-Dissipating Unit]

Figure 2:
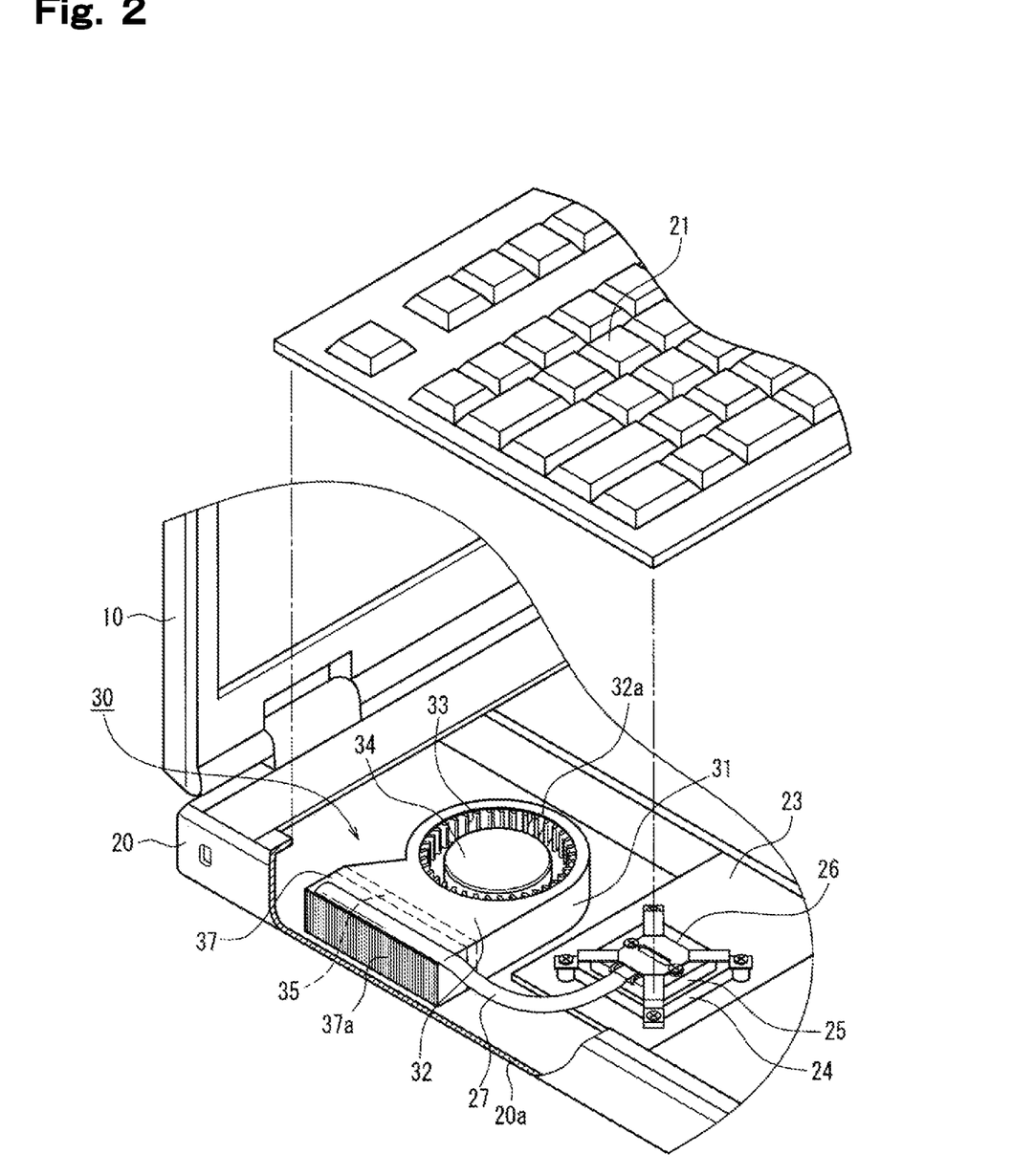
FIG. 2 is a schematic exploded perspective view illustrating a main structure of a heat-dissipating unit of the notebook computer as an example of the electronic device according to one embodiment.

Next, a structure of a heat-dissipating unit 30 mounted to the notebook computer 1 will be described with reference to FIG. 2 to FIG. 4. FIG. 2 is a schematic exploded perspective view illustrating a main structure of the heat-dissipating unit 30 of the notebook computer 1.

Figure 3:
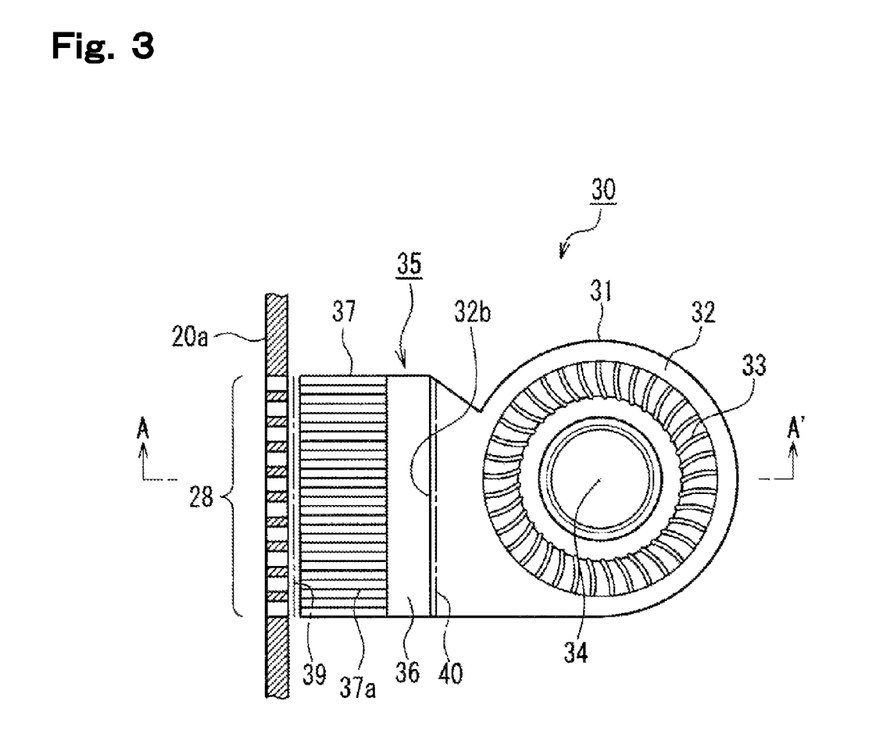
FIG. 3 is a schematic horizontal cross-sectional view illustrating a structure of the heat-dissipating unit of the notebook computer as an example of the electronic device according to one embodiment.

FIG. 3 is a schematic horizontal cross-sectional view illustrating the structure of the heat-dissipating unit 30. FIG. 4 is a schematic cross-sectional view (schematic vertical cross-sectional view) taken along the line A-A' shown in FIG. 3. FIG. 2 illustrates, in an enlarged manner, only a vicinity of a central processing unit (CPU) 24, among various electronic components disposed in the main unit 20, which is a typical heat-emitting component having its temperature maximized during operation, and the heat-dissipating unit 30 for releasing heat emitted from the CPU 24, to the exterior of a casing 20a forming an outer portion of the main unit 20.

As shown in FIG. 2, the CPU 24 is mounted and disposed on a circuit substrate 23 below the keyboard 21 disposed on the surface of the main unit 20 of the notebook computer 1. On the top surface of the CPU 24, a heat receiving section 25 is disposed for receiving heat generated while the CPU 24 is operating. The heat receiving section 25 is pressed against and fixed to the CPU 24 which is a heat source, by means of a fixing component 26 having spring-like legs.

To the heat receiving section 25, one end of a heat pipe 27, made of, for example, copper, is connected, for transferring the received heat to the heat-dissipating unit 30, and the other end of the heat pipe 27 is connected to the top surface of a heat-dissipating component 37 described below. Inside the heat pipe 27, for example, a heat conductive medium, such as an alternative for chlorofluorocarbon, having a high heat conductivity is sealed to efficiently transfer, to the heat-dissipating component 37, heat received from the CPU 24 by the heat receiving section 25.

The heat-dissipating unit 30 for effectively releasing heat from the CPU 24 mounted to the notebook computer 1, to the exterior of the casing 20a of the main unit 20 includes: the heat-dissipating component 37 including a plurality of fins 37a to which heat is transferred from the CPU 24; and a fan 31 for supplying air (cooling air) to the heat-dissipating component 37. As described above, the other end of the heat pipe 27 is connected to the top surface of the heat-dissipating component 37. Heat exchange between air (cooling air) supplied from the fan 31, and heat transferred from the CPU 24 to the heat-dissipating component 37 is performed, and the heated air is released to the exterior of the casing 20a. Air heated in the heat-dissipating component 37 is released to the exterior of the casing 20a through a discharge outlet 28 (see FIG. 1, and FIG. 3 and FIG. 4 referred to below) that is formed as slits of the casing 20a so as to correspond to the shape of the heat-dissipating component 37. Further, air (cooling air) to be supplied from the fan 31 to the heat-dissipating component 37 is drawn in through an air inlet 32a formed in the top surface of a fan case 32.

Figure 4:
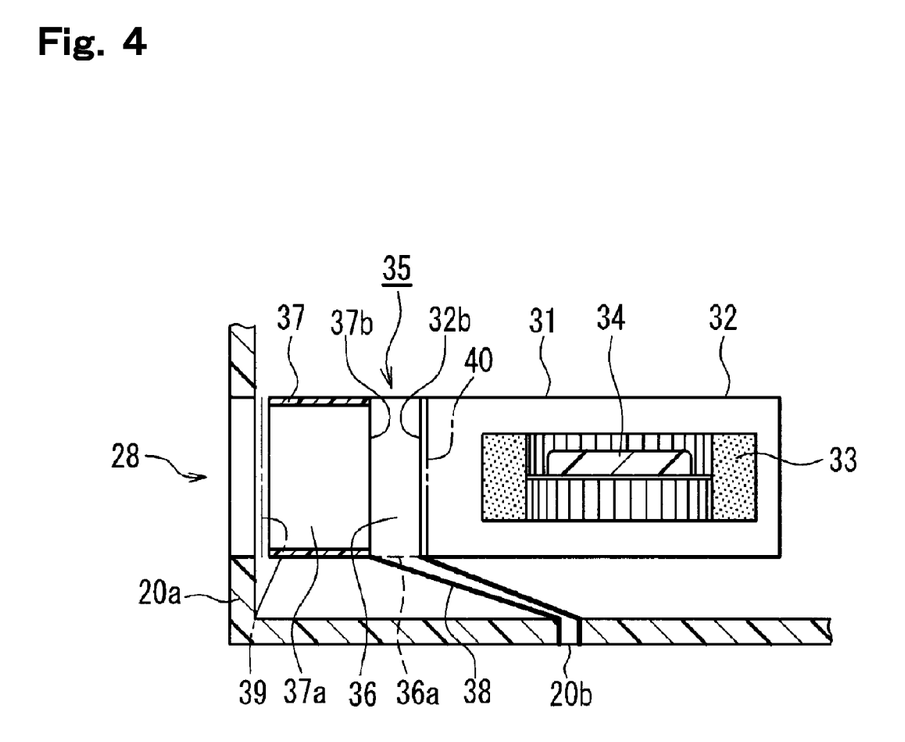
FIG. 4 is a schematic cross-sectional view (schematic vertical cross-sectional view) taken along the line A-A' shown in FIG. 3.

As shown in FIG. 2 to FIG. 4, in the fan 31, a fan main unit 33 accommodated in the fan case 32 rotates about a rotation shaft 34 corresponding to the rotation axis, to draw in ambient air through the air inlet 32a which is formed in the top surface of the fan case 32, and discharges the air as cooling air through an air outlet 32b formed on the heat-dissipating component 37 side. The shape of the entirety of the fan 31, the shape of the air inlet 32a, the shape of the fan main unit 33 which rotates about the rotation shaft 34, and the like as shown in FIG. 2 to FIG. 4 are exemplary ones. The fan 31 may be any of various types of cooling fans which can draw in ambient air through an air inlet, and discharge air through an air outlet, as conventionally used.

The heat-dissipating component 37 is made of a metal such as, for example, copper having a high heat conductivity, and has the plurality of fins 37a that are formed as a plurality of thin-plate-like components so as to extend parallel to a direction in which cooling air discharged from the fan 31 flows toward the exterior of the casing 20a. The cooling air having passed through the gaps among the fins 37a of the heat-dissipating component 37 is discharged outside the casing 20a through the discharge outlet 28 which is formed as slits in the casing 20a so as to correspond to the shape of the heat-dissipating component 37. The bottom surface of the heat-dissipating component 37 is flush with the bottom surface of the air outlet 32*b* of the fan 31, and the size of the heat-dissipating component 37 is such that, particularly, the width and the height of the heat-dissipating component 37 as viewed from the fan 31 side are equal to the width and the height of the air outlet 32*b* of the fan 31.

[Dust Removal Mechanism]

Figure 5:
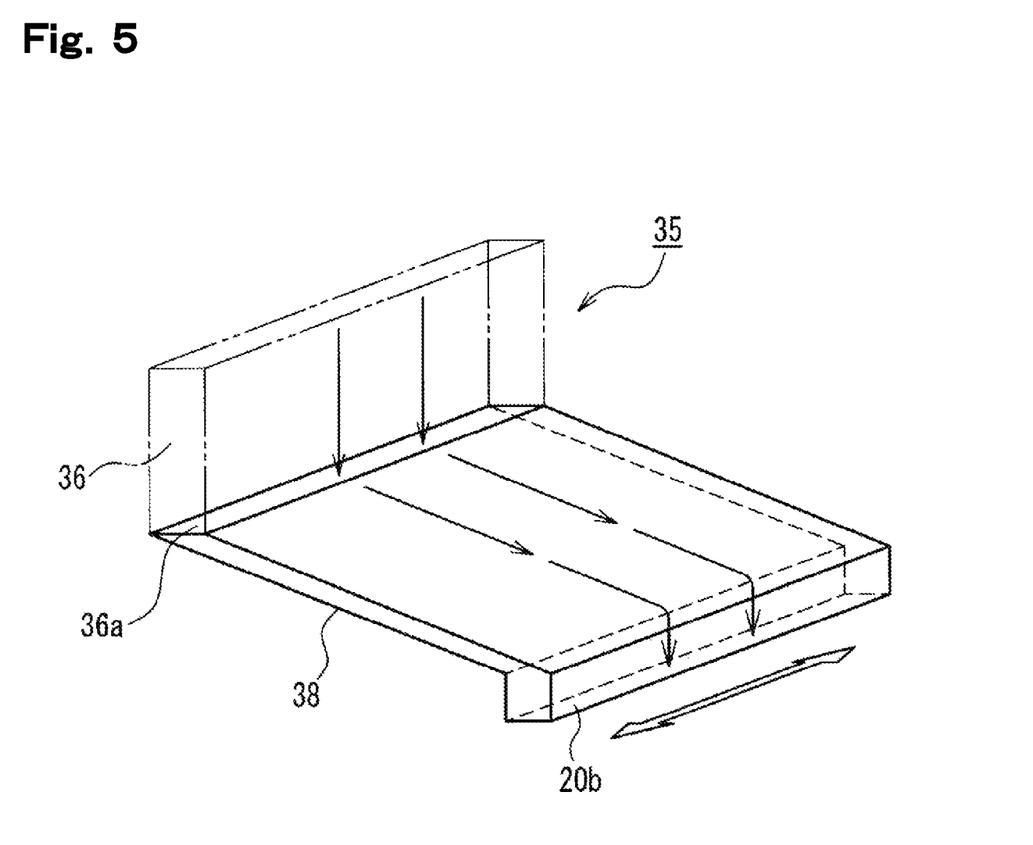
FIG. 5 is a schematic perspective view illustrating a shape of a dust removal path of the heat-dissipating unit of the notebook computer as an example of the electronic device according to one embodiment.

Next, a dust removal mechanism of the heat-dissipating unit 30 will be described with reference to FIG. 2 to FIG. 5. FIG. 5 is a schematic perspective view illustrating a shape of a dust removal path of the heat-dissipating unit 30 of the notebook computer 1.

As shown in FIG. 2 to FIG. 5, the heat-dissipating unit 30 does not have a structure in which the heat-dissipating component 37 is disposed in close contact with the air outlet 32*b* formed in the fan case 32 of the fan 31. Instead, a dust removal mechanism 35 is disposed, between the air outlet 32*b* of the fan 31 and the heat-dissipating component 37, for removing dust on a surface 37*b* (an inflow surface on which air (cooling air) flows from the fan 31 into the heat-dissipating component 37) of the heat-dissipating component 37 on a side that opposes the fan 31.

More specifically, a communicating path 36 is formed between the air outlet 32*b* of the fan 31 and the inflow surface 37*b* of the heat-dissipating component 37, for communicating therebetween, and the communicating path 36 has formed therein a dust removal path 38 communicating with the exterior of the casing 20*a*. Namely, as shown in FIG. 3 to FIG. 5, the dust removal path 38 is connected to the communicating path 36 through a first opening 36*a* formed in the bottom surface of the communicating path 36, and the communicating path 36 is in close contact with the air outlet 32*b* of the fan 31 and the inflow surface 37*b* of the heat-dissipating component 37, in portions other than the first opening 36*a*.

In a case where the dust removal mechanism 35 having such a structure is formed between the air outlet 32*b* of the fan 31 and the heat-dissipating component 37, the dust removal mechanism 35 is structured such that surfaces, other than the first opening 36*a* corresponding to a surface in which the dust removal path 38 is formed, are in close contact with the air outlet 32*b* of the fan 31 and the inflow surface 37*b* of the heat-dissipating component 37, and, therefore, when air is drawn through the dust removal path 38 by using, for example, a vacuum cleaner or the like, air outside the casing 20*a* is drawn through gaps among the plurality of fins 37*a* of the heat-dissipating component 37, the communicating path 36, and the dust removal path 38, and dust on the inflow surface 37*b* of the heat-dissipating component 37 is drawn together with the air. As a result, the notebook computer 1 can be provided which has mounted thereto the heat-dissipating unit 30 that enables an increase of cost and increase in the weight to be restrained, and enables dust on the heat-dissipating component 37 to be removed, with a simplified structure in which the communicating path 36 is formed between the air outlet 32*b* of the fan 31 and the inflow surface 37*b* of the heat-dissipating component 37 for communicating therebetween, and the dust removal path 38 communicating with the exterior of the casing 20*a* is formed in the communicating path 36.

The dust removal path 38 connects between the first opening 36*a* formed in the bottom surface of the communicating path 36 and a second opening 20*b* formed in the bottom surface of the casing 20*a*. In this structure, air is drawn into the communicating path 36 in the direction along the surfaces of the fins 37*a* of the heat-dissipating component 37. Therefore, dust on the heat-dissipating component 37 can be more efficiently removed as compared to a case where, for example, the first opening 36*a* is formed in any of end surfaces (on the right side and left side in FIG. 3) in the direction in which air (cooling air) flows in the communicating path 36. Further, since the dust removal path 38 is located below the main unit of the heat-dissipating unit 30, a space in which the dust removal path 38 is formed need not be additionally reserved, thereby restraining an increase of cost.

The first opening 36*a* and the second opening 20*b* are each formed in a direction orthogonal to a direction in which air supplied from the fan 31 flows, so as to have a length that is equal to the transverse span of the communicating path 36, as shown in FIG. 5. In this structure, by setting the suction opening of a vacuum cleaner against the second opening 20*b*, and in that state moving the suction opening of the vacuum cleaner in the direction of the length of the second opening 20*b*, dust on the entirety of the inflow surface 37*b* of the heat-dissipating component 37 can be easily removed.

The dust removal path 38 is formed so as to be tiled at an angle less than or equal to 90° relative to a direction (direction from the heat-dissipating component 37 to the fan 31) opposite to a direction in which air supplied from the fan 31 flows. In a case where the dust removal path 38 is formed so as to be tilted at such an angle, even when the first opening 36*a* is formed between the air outlet 32*b* formed in the fan case 32 of the fan 31, and the inflow surface 37*b* of the heat-dissipating component 37, air (cooling air) supplied from the fan 31 can be restrained from leaking through the dust removal path 38, and the air can be efficiently used for heat dissipation from the heat-dissipating component 37. Further, in a case where the dust removal path 38 is formed so as to be tilted at such an angle, following on the flow of air (cooling air) from the fan 31 toward the heat-dissipating component 37, ambient air is drawn into the communicating path 36 through the dust removal path 38, and together with air (cooling air) supplied from the fan 31 passes through the heat-dissipating component 37, thereby enabling temperature of hot air released to the exterior of the casing 20*a* to be reduced.

Further, the opening 20*b* is formed forward of the air outlet 32*b* of the fan 31 in the opposite direction from the direction in which air supplied from the fan 31 flows. In the present embodiment, the opening 20*b* is located below the fan 31. Thus, flow of air drawn in through the dust removal path 38 is less likely to disturb air supplied from the fan 31, thereby enhancing cooling efficiency.

Further, as shown in FIG. 4 and FIG. 5, the dust removal path 38 is formed so as to extend roughly along the direction in which air supplied from the fan 31 flows. In a case where the dust removal path 38 is thus formed, air (cooling air) supplied from the fan 31 can be restrained from leaking through the dust removal path 38, with an enhanced effectiveness, and, further, drawing-in of ambient air into the communicating path 36 can be further accelerated, thereby assuredly obtaining an effect of reducing the temperature of hot air released to the exterior of the casing 20*a*.

As shown in FIG. 4, in a case where the bottom surface of the heat-dissipating component 37 is flush with the bottom surface of the air outlet 32*b* of the fan 31, the dust removal path 38 can be easily formed so as to be tilted at an angle less than or equal to 90° relative to a direction (direction from the heat-dissipating component 37 toward the fan 31) opposite to a direction in which air supplied from the fan 31 flows.

As shown in FIG. 3 and FIG. 4, first shutter means 39 is provided on a surface (a discharge outlet side surface) opposite to the inflow surface 37*b* of the heat-dissipating component 37, for opening and closing the discharge outlet side surface. In a case where the first opening 36*a* is formed in the bottom surface of the communicating path 36, the first shutter means 39 can be configured to operate so as to close the discharge outlet side surface of the heat-dissipating component 37 stepwise from the bottom end side. When the first shutter means 39 has such a structure, a path of air drawn into the communicating path 36 from the exterior of the casing 20a through the heat-dissipating component 37 can be shifted stepwise toward the upper portion of the heat-dissipating component 37. Therefore, dust on the upper portion of the heat-dissipating component 37 can be easily removed.

Further, second shutter means 40 for opening and closing the air outlet 32b is provided at the air outlet 32b of the fan 31. In this structure, when dust on the inflow surface 37b of the heat-dissipating component 37 is removed, the air outlet 32b of the fan 31 is closed by the second shutter means 40, and dust on the inflow surface 37b of the heat-dissipating component 37 can be efficiently removed without drawing in air from the fan 31 side.

The first shutter means 39 and the second shutter means 40 may be of any of various opening and closing types, such as a sliding type, a rolling type, a hinge type, a blind type, or the like. Further, the first shutter means 39 and the second shutter means 40 can be operated by, for example, an opening and closing switch being operated.

[Dust Removal Method]

Figure 6:
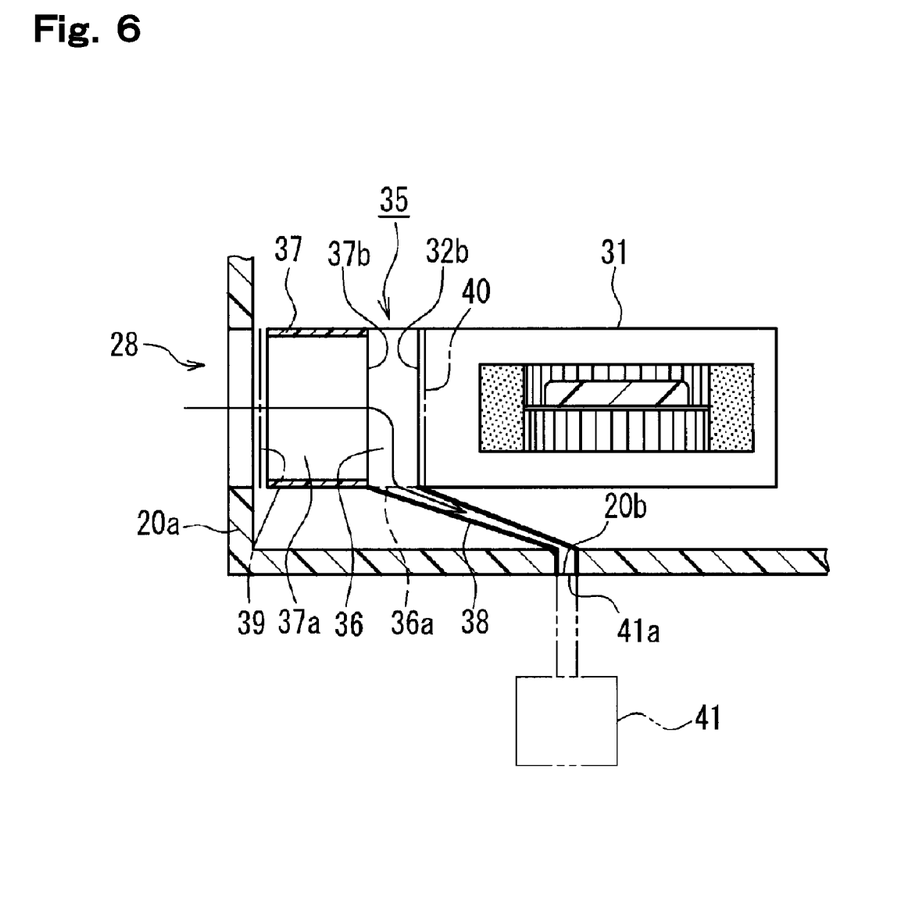
FIG. 6 is a schematic vertical cross-sectional view illustrating a method for removing dust on the heat-dissipating component of the heat-dissipating unit of the notebook computer as an example of the electronic device according to one embodiment.

Next, a method for removing dust on the heat-dissipating component 37 of the heat-dissipating unit 30 mounted to the notebook computer 1 will be described with reference to FIG. 5 and FIG. 6. FIG. 6 is a schematic vertical cross-sectional view illustrating a method for removing dust on the heat-dissipating component 37 of the heat-dissipating unit 30 of the notebook computer 1.

In a state where the fan 31 is operating so as to release, from the heat-dissipating component 37, heat which is generated when heat-emitting components such as the CPU 24 operate, the first shutter means 40 for opening and closing the discharge outlet side surface of the heat-dissipating component 37, and the second shutter means 40 for opening and closing the air outlet 32b of the fan 31 are each in an opened state.

In a case where dust on the inflow surface 37b of the heat-dissipating component 37 is removed, the second shutter means 40 for opening and closing the air outlet 32b of the fan 31 is caused to be in a closed state, and a vacuum cleaner 41 is operated in a state where an air drawing opening 41a of the vacuum cleaner 41 is applied to the second opening 20b formed in the bottom surface of the casing 20a. Thus, air outside the casing 20a is drawn through the discharge outlet 28, gaps among the plurality of fins 37a of the heat-dissipating component 37, the communicating path 36, and the dust removal path 38, thereby drawing dust on the inflow surface 37b of the heat-dissipating component 37 together with the air.

In this case, as indicated by an arrow ⇔ in FIG. 5, the air drawing opening 41a of the vacuum cleaner 41 is shifted in the direction of the length of the second opening 20b, thereby enabling dust on the entirety of the inflow surface 37b of the heat-dissipating component 37 to be easily removed.

Further, in a case where the first shutter means 39 is operated so as to close the discharge outlet side surface of the heat-dissipating component 37 stepwise from the bottom end side while air is being drawn by the vacuum cleaner 41, a path of air which is drawn into the communicating path 36 through the heat-dissipating component 37 from the exterior of the casing 20a can be shifted stepwise toward the upper portion of the heat-dissipating component 37, thereby enabling dust on the upper portion of the heat-dissipating component 37 to be easily removed.

For the present embodiment, an exemplary case is described in which the vacuum cleaner 41 is used to draw dust on the inflow surface 37b of the heat-dissipating component 37 through the dust removal path 38. However, when the first shutter means 39 for opening and closing the discharge outlet side surface of the heat-dissipating component 37 is caused to be in a closed state, and the second shutter means 40 for opening and closing the air outlet 32b of the fan 31 is caused to be in an opened state, dust on the inflow surface 37b of the heat-dissipating component 37 can be removed only by flow of air supplied from the fan 31.

According to the present embodiment, the dust removal path 38 is formed so as to be tilted at an angle less than or equal to 90° relative to a direction (direction from the heat-dissipating component 37 toward the fan 31) opposite to a direction in which air supplied from the fan 31 flows. However, the dust removal path 38 may not be formed in such a structure. If air (cooling air) supplied from the fan 31 can be prevented from leaking through the dust removal path 38 by the dust removal path 38 being covered with a lid or the like when the dust removal path 38 is not used, the dust removal path 38 may be formed so as to be tilted at an angle less than or equal to 90° relative to a direction (direction from the fan 31 toward the heat-dissipating component 37) in which air supplied from the fan 31 flows. This structure can be implemented by providing, for example, third shutter means for opening and closing the first opening 36a. However, in order to obtain an effect of drawing in ambient air into the communicating path 36, the dust removal path 38 may be formed so as to be titled at an angle less than or equal to 90° relative to a direction (direction from the heat-dissipating component 37 toward the fan 31) opposite to a direction in which air supplied from the fan 31 flows.

Further, according to the present embodiment, the dust removal path 38 is formed so as to connect between the first opening 36a formed in the bottom surface of the communicating path 36 and the second opening 20b formed in the bottom surface of the casing 20a. However, the present embodiment is not limited to such a structure. For example, the first opening 36a may be formed on one of the left end surface, the right end surface, or the top surface of the communicating path 36. However, in order to efficiently remove dust on the heat-dissipating component 37, and prevent a space in which the dust removal path 38 is formed from being additionally reserved, the dust removal path 38 may be formed so as to connect between the first opening 36a formed in the bottom surface of the communicating path 36, and the second opening 20b formed in the bottom surface of the casing 20a.

Figure 7:
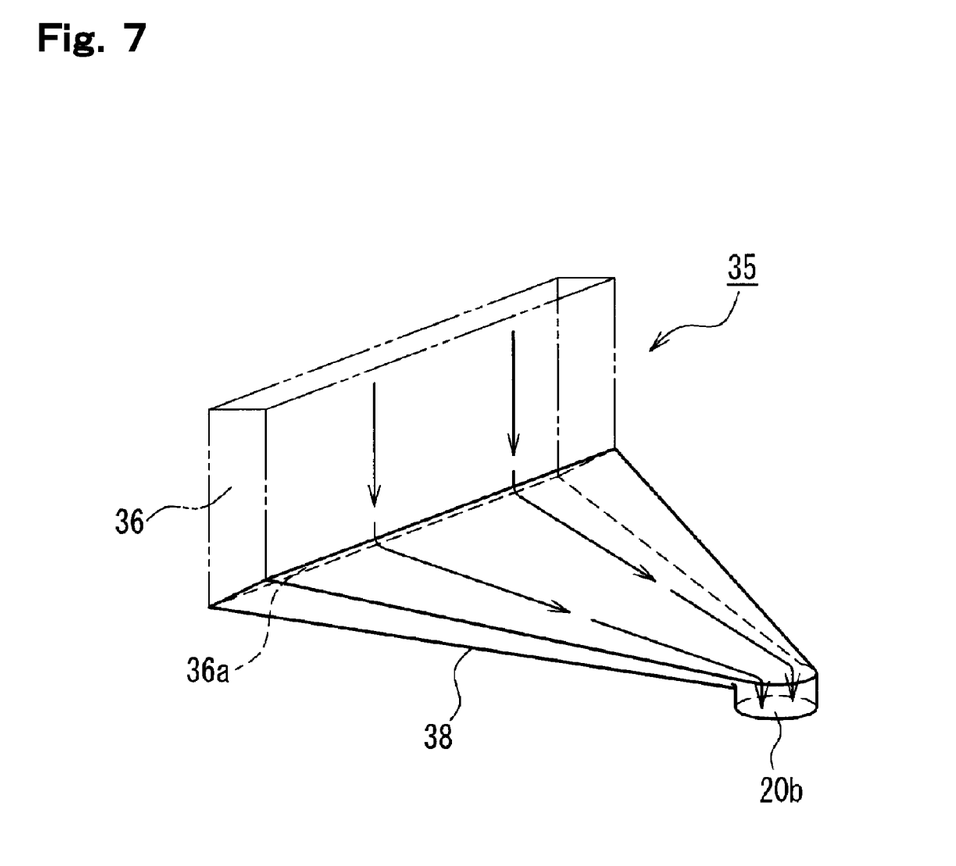
FIG. 7 is a schematic perspective view illustrating another exemplary shape of a dust removal path of the heat-dissipating unit of the notebook computer as an example of the electronic device according to one embodiment.

Further, for the present embodiment, an exemplary case is described in which the second opening 20b, formed in the bottom surface of the casing 20a, to which the dust removal path 38 is connected, is formed along a direction orthogonal to a direction in which air supplied from the fan 31 flows, so as to have the length which is equal to the transverse span of the communicating path 36 (see FIG. 5). However, the second opening 20b may be formed along a direction orthogonal to a direction in which air supplied from the fan 31 flows, so as to have a length that is shorter than the transverse span of the communicating path 36. Further, the second opening 20b may be, for example, a circular opening as shown in FIG. 7.

Figure 8:
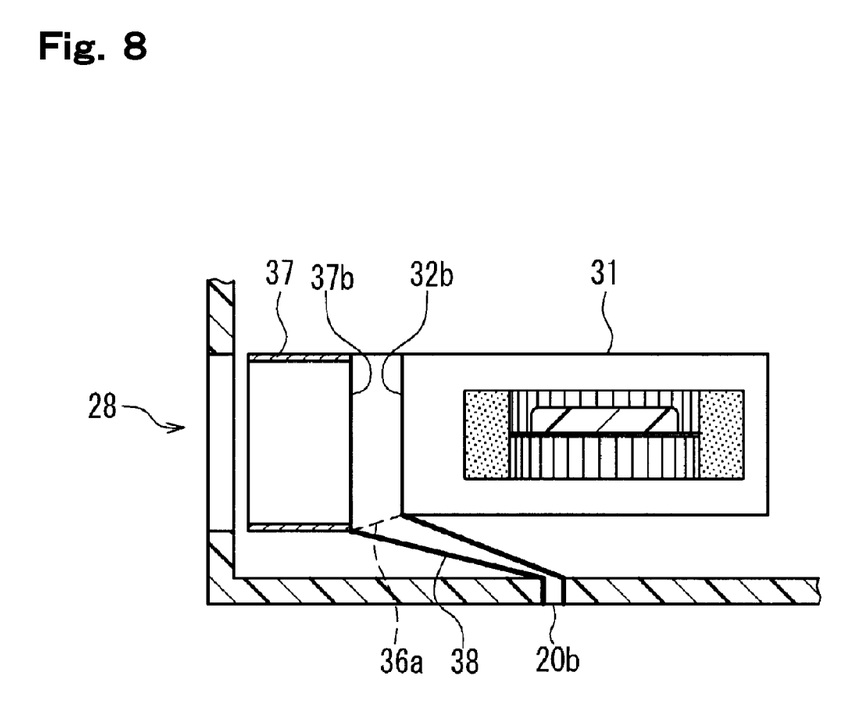
FIG. 8 is a schematic vertical cross-sectional view illustrating another exemplary structure of the heat-dissipating unit of the notebook computer as an example of the electronic device according to one embodiment.

Further, for the present embodiment, an exemplary case is described in which the bottom surface of the heat-dissipating component 37 is flush with the bottom surface of the air outlet 32b of the fan 31. However, as shown in FIG. 8, the bottom surface of the heat-dissipating component 37 may be located at a position lower than a position of the bottom surface of the air outlet 32b of the fan 31. In this structure, the dust removal path 38 can be formed, with enhanced ease, so as to be tilted at an angle less than or equal to 90° relative to a direction (direction from the heat-dissipating component 37 toward the fan 31) opposite to a direction in which air supplied from the fan 31 flows. Thus, following on the flow of air (cooling air) from the fan 31 toward the heat-dissipating component 37, ambient air is drawn in through the second opening 20b via the first opening 36a, and together with air (cooling air) supplied from the fan 31 passes through the heat-dissipating component 37. Therefore, the temperature of hot air released through the discharge outlet 28 to the exterior can be reduced. In the structure shown in FIG. 8, since the second opening 20b is formed below the fan 31, the inflow surface 37b of the heat-dissipating component 37 is expanded downward with respect to the air outlet 32b of the fan 31. However, the inflow surface 37b of the heat-dissipating component 37 may be expanded in the orientation toward where the second opening 20b is arranged.

Further, for the present embodiment, an exemplary case is described in which the first shutter means 39 for opening and closing the discharge outlet side surface of the heat-dissipating component 37, and the second shutter means 40 for opening and closing the air outlet 32b of the fan 31 are provided. However, the first shutter means 39 and the second shutter means 40 may not be provided. Further, one of the first shutter means 39 or the second shutter means 40 may be provided.

Further, for the present embodiment, an exemplary case is described in which the notebook computer 1, in which the cover component 10 having the display device 12 disposed in the inner side surface thereof is pivotably mounted to the main unit 20, is the electronic device. However, the electronic device is not limited to the notebook computer 1 as described above. The electronic device may be various portable electronic devices such as tablet-type personal computers, mobile telephones, hand-held game devices, downsized television receivers, blu-ray disc players, and navigation systems. Further, the electronic device may be various stationary electronic devices such as desktop personal computers and liquid crystal projectors.

Further, according to the present embodiment, the CPU 24 is described as an example of a heat-emitting component which emits heat during operation. The heat-emitting component is not limited to the CPU 24. Various heat-emitting components, such as semiconductor chips in video boards and the like for image processing, and secondary batteries, which emit heat to be released to the exterior of the casings, are considered as the heat-emitting component.

Further, for the present embodiment, an exemplary case is described in which the heat pipe 27 is used to transfer heat from the CPU 24 to the heat-dissipating component 37. However, the heat-dissipating component 37 may be disposed in direct contact with the CPU 24, which is one of the heat-emitting components, so as to enable heat transfer.

As described above, the embodiment has been described as an exemplary technique of the present disclosure. For that purpose, the accompanying drawings and the detailed description are provided.

Therefore, components indicated in the accompanying drawings and the detailed description may include not only components which need to be provided in order to solve the problems, but also components which need to be illustrated for describing the implementation but may not be provided for solving the problems. Therefore, the components which may not be provided should not be instantly construed as being indispensable even if the components which may not be provided are indicated in the accompanying drawings and the detailed description.

Further, the embodiment described above is intended to illustrate the technique of the present disclosure. Various modifications, replacements, additions, and deletions may be devised within the scope of claims or within the equivalent scope.

What is claimed is:

1. An electronic device comprising:
    a casing in which electronic components including a heat-emitting component, which emits heat during operation, are accommodated; and
    a heat-dissipating unit that includes
        a heat-dissipating component having a plurality of fins to which heat is transferred from the heat-emitting component, and
        a fan for supplying air to the heat-dissipating component, wherein heat exchange between heat transferred from the heat-emitting component to the heat-dissipating component, and air supplied from the fan, is performed to release heated air to the exterior of the casing; wherein
    a communicating path is formed, between an air outlet of the fan, and a surface of the heat-dissipating component on a side that opposes the fan, for communicating therebetween;
    a dust removal path is formed connected to the communicating path so as to communicate with the exterior of the casing; and
    the dust removal path is formed so as to be tilted at an angle less than or equal to 90° relative to a direction opposite to a flow direction of air supplied from the fan.

2. The electronic device according to claim 1, wherein
    the dust removal path communicates with an opening formed in an outer surface of the casing, and
    the opening is located forward of the air outlet of the fan in the direction opposite to the flow direction of air supplied from the fan.

3. The electronic device according to claim 2, wherein the communicating path includes the opening at a connection portion at which the communicating path connects with the dust removal path, and portions other than the connection portion are in close contact with the heat-dissipating component and the air outlet.

4. The electronic device according to claim 1, wherein a bottom surface of the heat-dissipating component is flush with a bottom surface of the air outlet of the fan, or is located lower than the bottom surface of the air outlet of the fan.

5. The electronic device according to claim 1, wherein first shutter means is provided, on a surface of the heat-dissipating component, on a side opposite to the side that opposes the fan, for opening and closing the surface, and the first shutter means operates so as to close the surface of the heat-dissipating component stepwise from a bottom end side.

6. The electronic device according to claim 1, wherein second shutter means is provided, at the air outlet of the fan, for opening and closing the air outlet.

* * * * *